United States Patent
Lee et al.

(10) Patent No.: US 7,714,376 B2
(45) Date of Patent: May 11, 2010

(54) NON-VOLATILE MEMORY DEVICE WITH POLYSILICON SPACER AND METHOD OF FORMING THE SAME

(75) Inventors: Tzyh-Cheang Lee, Hsinchu (TW); Jiunn-Ren Hwang, Hsinchu (TW); Tsung-Lin Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 527 days.

(21) Appl. No.: 11/612,500

(22) Filed: Dec. 19, 2006

(65) Prior Publication Data

US 2008/0142867 A1   Jun. 19, 2008

(51) Int. Cl.
*H01L 29/788* (2006.01)

(52) U.S. Cl. .................. 257/316; 257/319; 257/320
(58) Field of Classification Search ......... 257/315–320; 438/257–258, 593–594
See application file for complete search history.

(56) References Cited

U.S. PATENT DOCUMENTS

| 5,760,435 | A | 6/1998 | Pan |
| 6,831,325 | B2 | 12/2004 | Lojek |
| 2002/0045319 | A1* | 4/2002 | Ogura et al. ............... 438/303 |
| 2005/0045942 | A1* | 3/2005 | Jung ........................ 257/316 |
| 2008/0076221 | A1* | 3/2008 | Kang et al. ............... 438/267 |

OTHER PUBLICATIONS

"Ultra-High Speed Direct Tunneling Memory (DTM) for Embedded RAM Applications" Tsunoda et al., 2004; pp. 152-153.
"Embedded Twin MONOS Flash Memories with 4ns and 15ns Fast Access Times" Ogura et al., 2003; pp. 207-210.

* cited by examiner

*Primary Examiner*—Dung A. Le
(74) *Attorney, Agent, or Firm*—Thomas, Kayden, Horstemeyer & Risley

(57) ABSTRACT

Non-volatile memory device with polysilicon spacer and method of forming the same. A dielectric layer lines a sidewall of a polysilicon gate. A polysilicon spacer is patterned on the dielectric layer adjacent to the sidewall of the polysilicon gate. A protection spacer is patterned on the dielectric layer and disposed on the polysilicon spacer adjacent to the sidewall of the conductive gate for preventing a shortage path between the polysilicon gate and the polysilicon spacer during a subsequent silicidation process.

13 Claims, 5 Drawing Sheets

NON-VOLATILE MEMORY DEVICE WITH POLYSILICON SPACER AND METHOD OF FORMING THE SAME

TECHNICAL FIELD

The present invention relates to semiconductor integrated memory cells, and particularly to non-volatile memory devices with polysilicon spacers and methods of forming the same.

BACKGROUND

Non-volatile semiconductor memory cells using a floating gate to store charges thereon and memory arrays of such non-volatile memory cells formed in a semiconductor substrate are well known in the art. Due to the growing demand for higher densities, a continuous increase in array density and the scaling of the supply voltage become mandatory. There have been may attempts to solve this problem by the fabrication of high-performance flash memory devices using polysilicon spacer technology. For example, in "sidewall gate" device applications, a floating gate is formed of a first polysilicon layer, while a select gate is formed of a polysilicon spacer. Also, a so-called Halo SONOS device, in the paper "Embedded Twin MONOS Flash Memories with 4 ns and 15 ns Fast Access Times" by Tomoko et al., presented in 2003 symposium on VLSI technology digest of technical papers, contains a word gate and polysilicon spacers acting dual sidewall control gates. In addition, one unique memory, Direct Tunneling Memory (DTM), in the paper "Ultra-High Speed Direct Tunneling (DTM) for Embedded RAM Application", presented in 2004 symposium on VLSI technology digest of technical papers, uses sidewall control gates formed of polysilicon on both sides of a floating gate and offset source/drain regions without overlapping the floating gate.

Typically, the polysilicon spacer technology includes depositing a polysilicon layer on the chip and then partially selectively removing the polysilicon layer by using anisotropic dry etch techniques. It is, however, very difficult to control this selective etching operation, for example the spacer uniformity of shape, width, thickness and the like after etching. FIG. 1 is a cross-sectional diagram illustrating a conventional memory device with a pair of polysilicon spacers. In general, an oxide layer and a first polysilicon layer are successively deposited on a semiconductor substrate 10 and then patterned as a gate oxide layer 12 and a polysilicon gate 14 from the use of photolithography and etching process. Next, an integrated dielectric layer 16 is conformally deposited on the substrate 10 and sidewalls of the polysilicon gate 14. Then a second polysilicon layer is deposited followed by an anisotropic etch-back process, which forms polysilicon spacers 18 on opposite sides of the polysilicon gate 14. The integrated dielectric layer 16 is also etched, leaving this integrated dielectric layer 16 only underlying the polysilicon spacers 18. After forming source/drain regions 20 in the substrate 10, a silicidation process is performed to form metal silicide layers 22 on the exposed surfaces of the polysilicon gate 14 and the source/drain regions 20 respectively.

The anisotropic etch-back process, however, cannot well control dimensions and profiles of the polysilicon spacers 18 to facilitate proper device design. Also, this etch-back step often damages the integrated dielectric layer 16 to cause a cave thereon, thus a subsequent silicidation process cannot be perfectly performed. Particularly, due to damages to the integrated dielectric layer 16, undesired metal silicide regions 22a exists on the damaged portion of the integrated dielectric layer 16 during the subsequent silicidation step, resulting in a shortage path bridging the polysilicon gate 14 and the polysilicon spacer 18.

It is therefore desirable to provide a novel profile of the non-volatile memory device for preventing a shortage path between the polysilicon gate and the polysilicon spacer during a silicidation process.

SUMMARY OF THE INVENTION

Embodiments of the present invention include a non-volatile memory device with a protection spacer on a polysilicon spacer along one sidewall of a polysilicon gate to prevent a shortage path occurred between the polysilicon spacer and the polysilicon gate during a subsequent silicidation process.

In one aspect, the present invention provides a non-volatile memory device having a conductive gate patterned on a semiconductor substrate. A dielectric layer lines the sidewall of the conductive gate. A conductive spacer covers a first portion of the dielectric layer adjacent to the sidewall of the conductive gate. A protection spacer covers a second portion of the dielectric layer adjacent to the sidewall of the conductive gate. The protection spacer is disposed on the conductive spacer for preventing a shortage path between the conductive gate and the conductive spacer during a silicidation process.

In another aspect, the present invention provides a method of forming a nonvolatile memory device including the following steps. A conductive gate having sidewalls is patterned on a substrate, and then a first dielectric layer is formed on the substrate to cover the conductive gate. A pair of conductive spacers is patterned on the first dielectric layer adjacent to the sidewalls of the conductive gate respectively. A second dielectric layer is formed on the conductive spacers and the first dielectric layer. By performing an etch-back process, the second dielectric layer is patterned as a pair of dielectric spacers on the conductive spacers respectively. Also, portions of the first dielectric layer not covered by the dielectric spacers and the conductive spacers are removed. Therefore, each of the conductive spacers is adjacent to a relatively lower portion of the sidewall of the conductive gate, and each of the dielectric spacers is adjacent to a relatively upper portion of the sidewall of the conductive gate.

In another aspect, the present invention provides a non-volatile memory device having a gate dielectric layer on a semiconductor substrate, a polysilicon gate on the gate dielectric layer and having opposite sidewalls, a pair of dielectric layers lining the opposite sidewalls of the polysilicon gate respectively, a pair of polysilicon spacers on the dielectric layers adjacent to the opposite sidewalls of the polysilicon gate respectively; and a pair of dielectric spacers on the polysilicon spacers and the dielectric layers adjacent to the opposite sidewalls of the conductive gate respectively.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
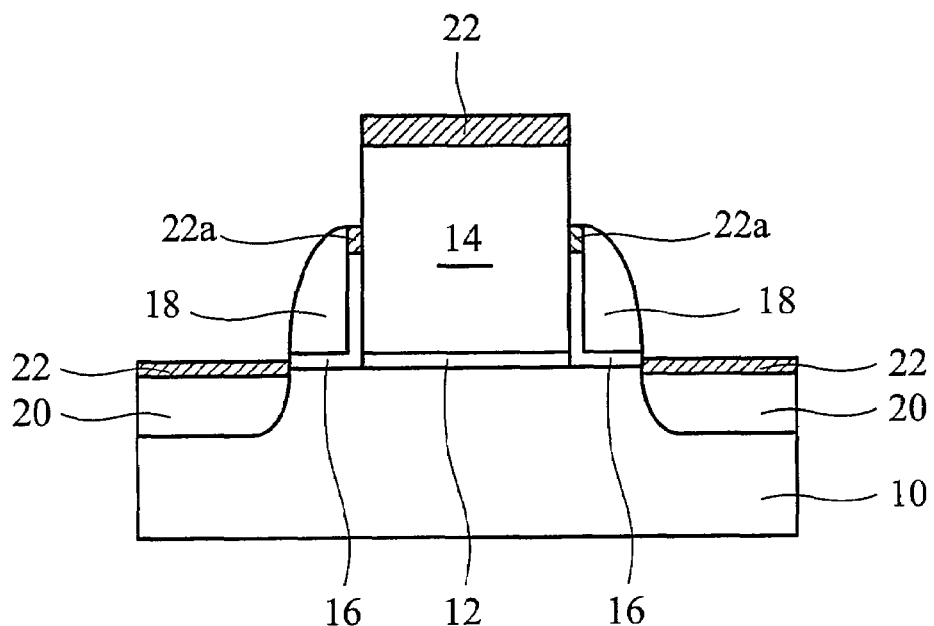
FIG. 1 is a cross-sectional diagram illustrating a conventional memory device with a pair of polysilicon spacers.

Embodiments of the present invention provide a non-volatile memory device with at least one polysilicon spacer on a sidewall of a polysilicon gate, and methods of fabricating the same. Particularly, a protection spacer is provided on the polysilicon spacer along the sidewall of the polysilicon gate to prevent a shortage path occurred there between during a subsequent silicidation process. The method of fabricating the same can be easily achieved by adding a deposition step and an etch-back process for forming the protection spacer on the polysilicon spacer, which is compatible with the existing gate processes in the non-volatile memory technology. The present invention is for use in various non-volatile memory cell applications employing a polysilicon spacer structure, including, but are not limited to, for example sidewall gate devices, DTM devices, twin MONOS memory cells, sidewall floating gate memory cells, and the like.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
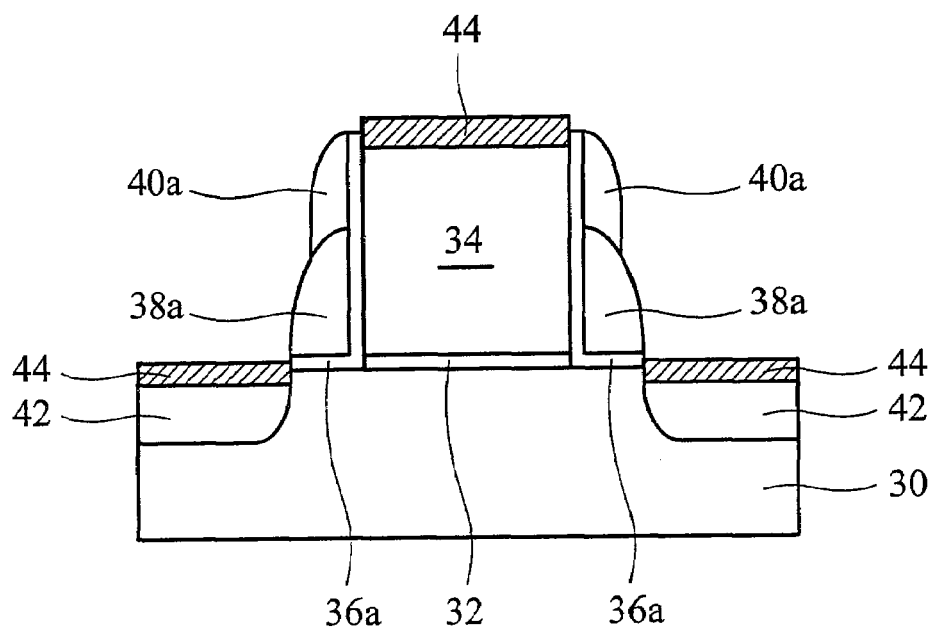
FIG. 2 is a cross-sectional diagram illustrating an exemplary embodiment of a non-volatile memory device having conductive spacers and protection spacers.

Herein, a cross-sectional diagram of FIG. 2 illustrates an exemplary embodiment of a memory device having polysilicon spacers. A substrate 30 has an active device region for the use of a non-volatile memory cell. The non-volatile memory cell comprises a gate dielectric layer 32 patterned on the substrate 30, a conductive gate 34 patterned on the gate dielectric layer 32, a pair of conductive spacers 38a disposed on opposite sidewalls of the conductive gate 34, an integrated dielectric layer 36a sandwiched between the conductive spacer 38a and the conductive gate 34, a pair of protection spacers 40a disposed over the conductive spacers 38a on opposite sidewalls of the conductive gate 34, source/drain regions 42 in the substrate 30, and metal silicide layers 44 on the exposed surfaces of the conductive gate 34 and the source/drain regions 42. Along each sidewall of the conductive gate 34, the conductive spacer 38a is disposed adjacent to the relatively lower sidewall portion of the conductive gate 34, while the protection spacer 40a is disposed adjacent to the relatively upper sidewall portion of the conductive gate 34.

In one embodiment, the conductive gate 34 is formed of polysilicon, the conductive spacer 38a is formed of polysilicon, and the protection spacer is formed of a dielectric material for isolating the two adjacent polysilicon structures. The protection spacer 40a is formed after the formation of the conductive spacer 38a, and a damaged portion (e.g., a cave) on the integrated dielectric layer 36a caused by an etch-back process for patterning the conductive spacers 38a can be therefore covered or compensated by the protection spacer 40a. This eliminates a shortage path between the conductive gate 34 and conductive spacer 38a in a subsequent silicidation process so as to solve the conventional reliability issues.

In an exemplary embodiment of the present invention, cross-sectional diagrams of FIGS. 3A to 3G illustrate a method of forming the protection spacers over the conductive spacers as shown in FIG. 2.

Figure 3A:
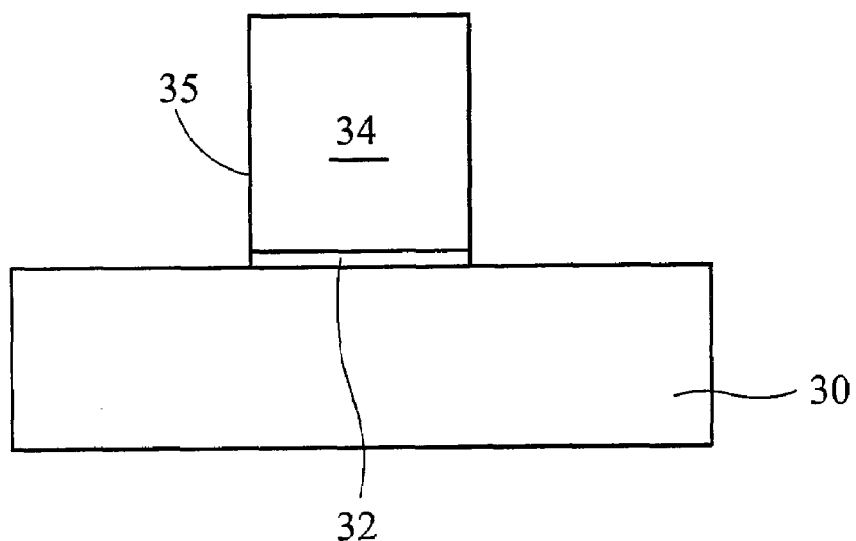
FIGS. 3A to 3G are cross-sectional diagrams illustrating a method of forming the protection spacers over the conductive spacers as shown in FIG. 2.

In FIG. 3A, a substrate 30 is provided with an active device region for a non-volatile memory cell, on which a first dielectric layer and a first conductive layer are successively deposited and then patterned as a gate dielectric layer 32 and a conductive gate 34. The patterning step may be accomplished using photolithography and etching to transfer the pattern defined by a photomask to the deposited materials. The photolithography process may include photoresist coating, soft baking, mask aligning, exposing, post-exposure baking, developing photoresist, hard baking, and photoresist stripping. The etching process may include wet etch, dry etch, ion-reactive-etch (RIE), and other suitable processing.

For exemplary purposes the substrate 30 may be a silicon substrate. The invention also has application to other semiconductor substrates, for example a substrate including an elementary semiconductor such as silicon, germanium, and diamond, or a compound semiconductor such as silicon carbide, gallium arsenic, indium arsenide, and indium phosphide. The substrate 30 may include an epitaxial layer overlying a bulk semiconductor, a silicon germanium layer overlying a bulk silicon, a silicon layer overlying a bulk silicon germanium, or a semiconductor-on-insulator (SOI) structure. The gate dielectric layer 32 may be a silicon oxide layer with a thickness between about 5 to about 150 Angstroms, for example, formed through a thermal oxidation process or a chemical vapor deposition (CVD) process. It is to be appreciated other well-known dielectric material such as oxides, nitrides, and combinations thereof for forming the first dielectric layer. The thickness of the gate dielectric layer 32 is chosen specifically for the scaling requirements of the non-volatile memory technology. The conductive gate 34 is a polysilicon layer with a thickness between about 800 Angstroms to about 2000 Angstroms, which may be deposited through methods including, but are not limited to, Low Pressure CVD (LPCVD) methods, CVD methods and Physical Vapor Deposition (PVD) sputtering methods employing suitable silicon source materials. If desired the polysilicon layer may be ion implanted to the desired conductivity type. It is to be appreciated other well-known conductive materials such as metal, single crystalline silicon, or combinations thereof for forming the first conductive layer.

Figure 3B:
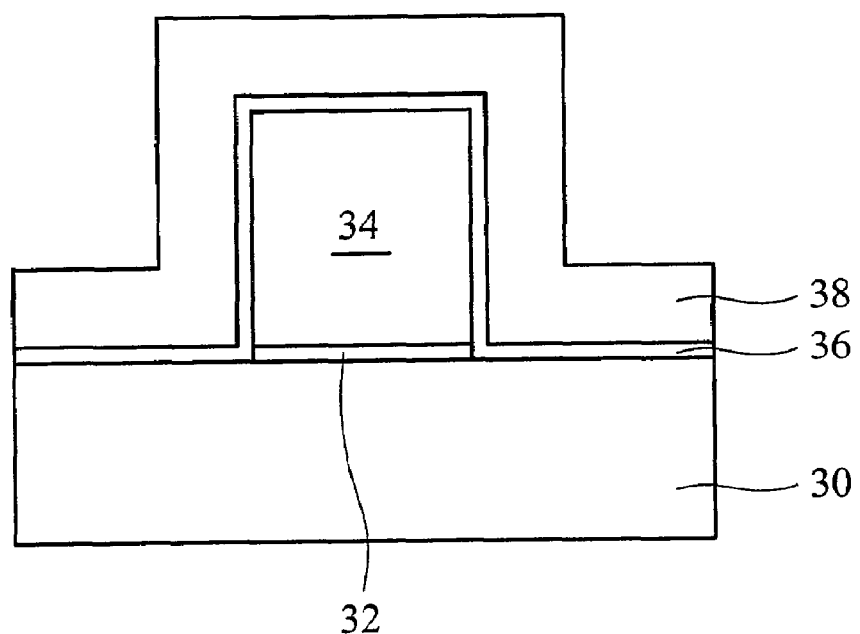

In FIG. 3B, a second dielectric layer 36 and a second conductive layer 38 are successively formed on the stacked structure as depicted in FIG. 3A. The second dielectric layer 36 conformally covers the exposed surfaces of the conductive gate 34 and the substrate 30, especially lining sidewalls 35 of the conductive gate 34 in order to insulate the conductive gate 34 from the second conductive layer 38. In one embodiment, the second dielectric layer 36 is formed of silicon oxide grown on the surfaces of the conductive gate 34 and the substrate 30 through a thermal oxidation process. In one embodiment, the second dielectric layer 36 is formed of an ONO structure, including an oxide layer, a nitride layer and an oxide layer. It is to be appreciated other non-conductive material for forming the second dielectric layer 36 through CVD methods. The second conductive layer 38 is a polysilicon layer formed through, for example Low Pressure CVD (LPCVD) methods, CVD methods and Physical Vapor Deposition (PVD) sputtering methods employing suitable silicon source materials. If desired the polysilicon layer may be ion implanted to the desired conductive type. Other well-known gate electrode material such as metal, metal alloys, single crystalline silicon, or any combinations thereof, is also appreciated to form the second conductive layer 38.

Figure 3C:
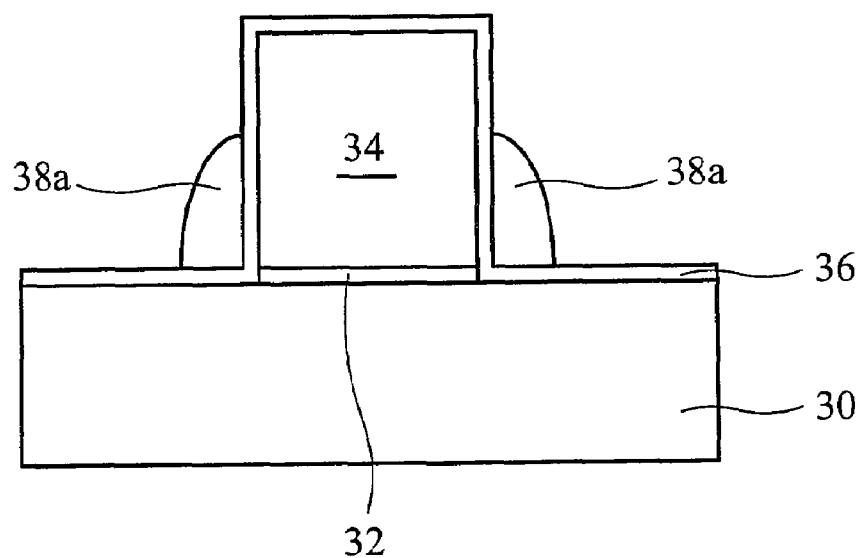

In FIG. 3C, the second conductive layer 38 is etched back through an anisotropic etch process, leaving a pair of conductive spacers 38a on opposite sidewalls of the conductive gate 34. The etch-back process may use dry etch, RIE (Reactive Ion Etching), or other plasma etching processes. The conductive spacers 38a are disposed adjacent to the lower sidewall portions of the conductive gate 34, and isolated from the conductive gate 34 by the second dielectric layer 36.

Figure 3D:
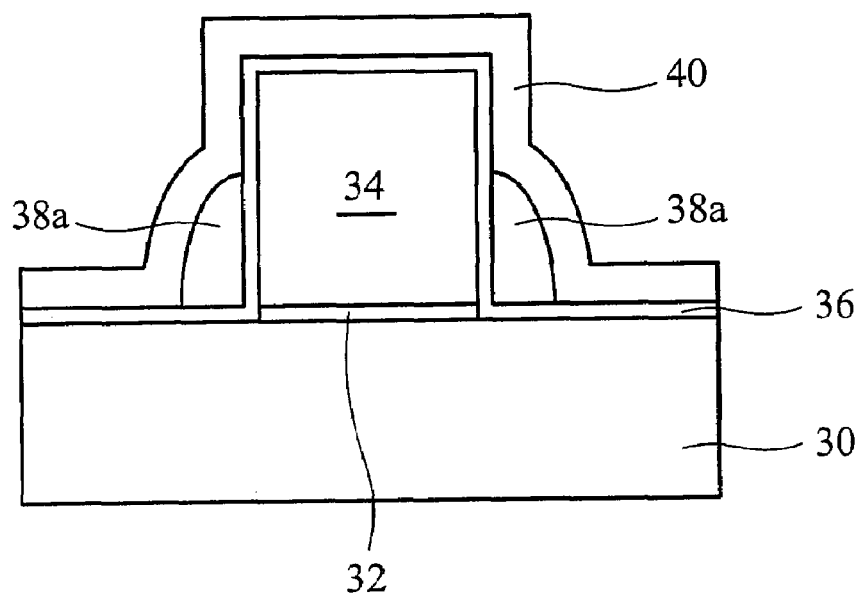

In FIG. 3D, a third dielectric layer 40 is formed over the substrate 30 by a blanket deposition to cover the conductive spacers 38a and the second dielectric layer 36. The third dielectric layer 40 is used to protect the conductive spacers 38a, and may compensate for any damaged portion of the second dielectric layer 36 if the previously etch-back process damages the third dielectric layer 36. The third dielectric layer 40 may be formed of silicon oxide with a thickness between about 100 to about 500 Angstroms, for example, formed through a thermal oxidation process or a chemical vapor deposition (CVD) process. It is to be appreciated other well-known dielectric material such as oxides, silicon nitride, oxynitride, and combinations thereof for forming the third dielectric layer 40.

Figure 3E:
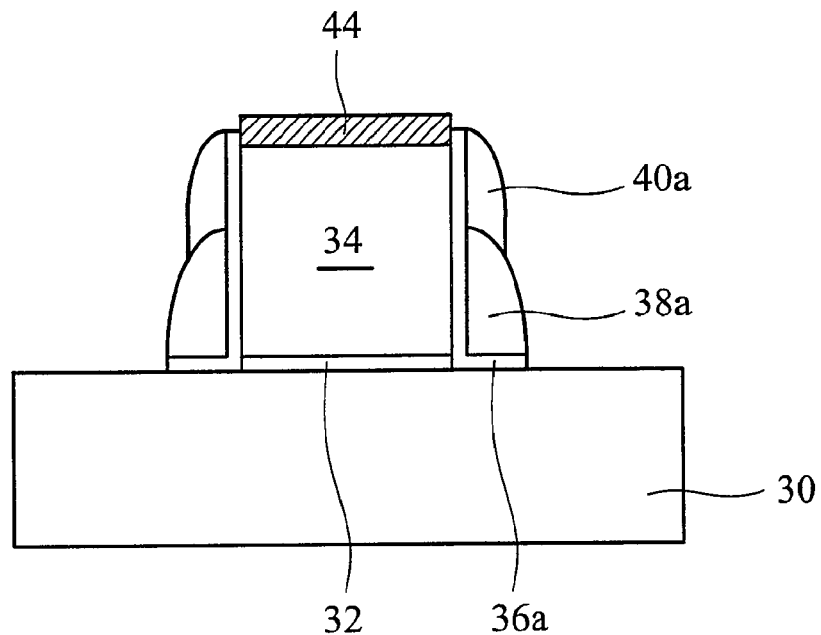

In FIG. 3E, the third dielectric layer 40 is etched back through an anisotropic etch process, leaving dielectric spacers 40a over the conductive spacers 38a respectively. The dielectric spacers 40a, acting protection spacers 40a adjacent to the upper sidewall portion of the conductive gate 34, protect the top of the conductive spacers 38a from exposure. The etch-back process may use dry etch, RIE (Reactive Ion Etching), or other plasma etching processes. During this etch-back process, uncovered portions of the second dielectric layer 36 underlying the protection spacers 40a and the conductive spacers 38a are also removed to expose the substrate 30 and the top of the conductive gate 34. The remainder of the second dielectric layer 36 serves as an integrated dielectric layer 36a sandwiched between the conductive gate 34 and the conductive spacer 38a. It is noted that the integrated dielectric layer 36a and the protection spacers 40a cover the sidewalls of the conductive gate 34 without exposing a path between the conductive spacer 38a and the conductive gate 34.

Figure 3F:
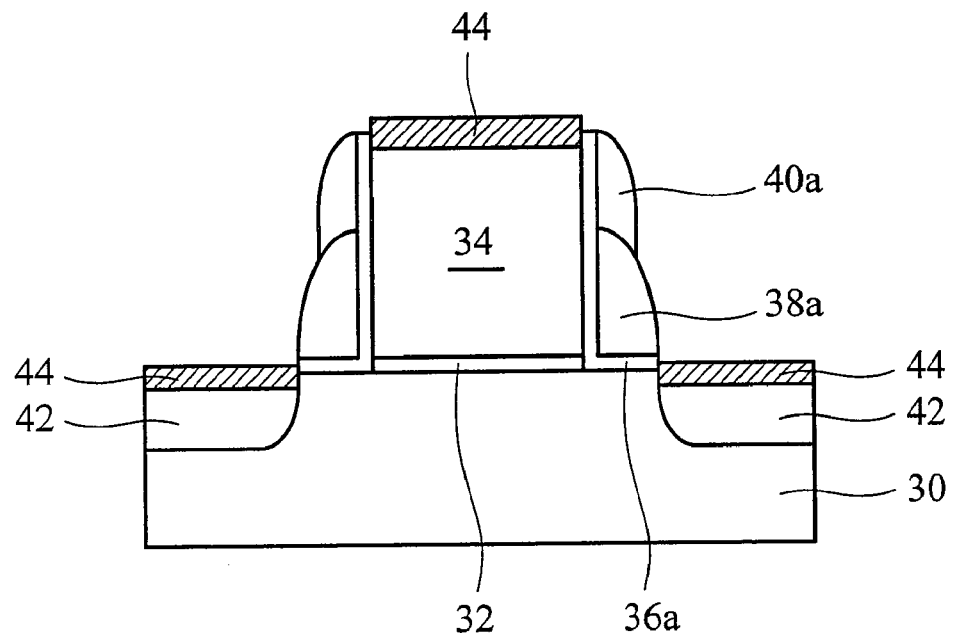
Figure 3G:
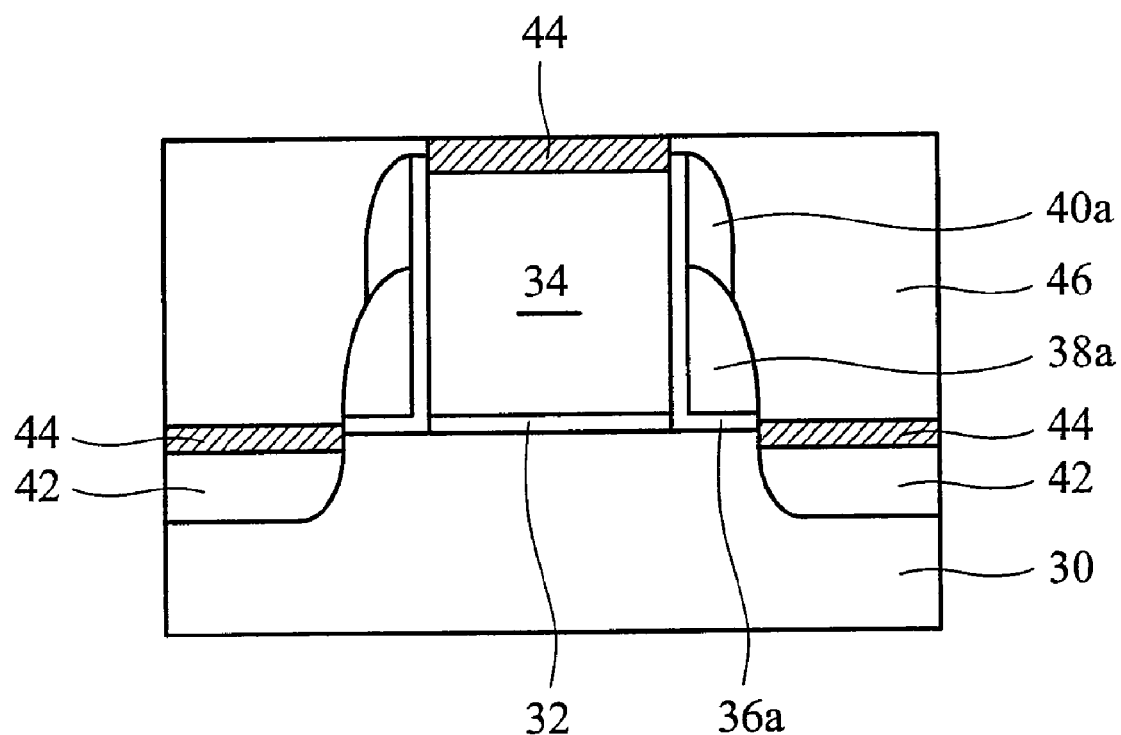

In FIG. 3F, an ion implantation process is performed to implant various dopant species into the substrate 30, resulting in source/drain regions 42. Next, a silicidation process is performed to form silicide layers 44 on the conductive gate 34 and the source/drain regions 42. Thereafter, in FIG. 3G, an inter-layer-dielectric (ILD) layer 46 is deposited on the substrate 30, and then a contact process and backend processes will be performed in the ILD layer 46.

In the silicidation process, for example, a metal layer of cobalt, nickel, titanium, tungsten, or metal nitrides is deposited through physical vapor deposition (PVD), chemical vapor deposition (CVD) or other sputtering methods, followed by an annealing procedure, thus the selected metal will spontaneously combine with silicon into metal silicide. The unconverted metal is then removed. The metal silicide layers 44 are used for reducing the RC time constant and improving operations of reading, programming, and erasing. As previously stated, the protection spacers 40a protect the top of the conductive spacer 38a and the sidewall of the conductive gate 34 from exposure, thus a shortage path between the conductive gate 34 and the conductive spacer 38a is avoided in the silicidation process.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A non-volatile memory device, comprising:
   a conductive gate patterned on a semiconductor substrate and having at least one sidewall;
   a dielectric layer having a portion lining said sidewall of said conductive gate;
   a conductive spacer patterned on said dielectric layer and disposed adjacent to said sidewall of said conductive gate; and
   a protection spacer patterned on said dielectric layer and disposed on said conductive spacer adjacent to said sidewall of said conductive gate, wherein said protection spacer is directly on said portion of said dielectric layer and directly on said conductive spacer.

2. The flash memory device of claim 1, wherein said conductive spacer is disposed adjacent to a relatively lower portion of said sidewall of said conductive gate, and said protection spacer is disposed adjacent to a relatively upper portion of said sidewall of said conductive gate.

3. The flash memory device of claim 1, wherein said dielectric layer extends from said sidewall of said conductive gate to a portion of said semiconductor substrate.

4. The flash memory device of claim 1, wherein said dielectric layer is covered by said conductive spacer and said protection spacer.

5. The flash memory device of claim 1, wherein said protection spacer comprises a dielectric material layer.

6. The flash memory device of claim 1, further comprising a metal silicide layer on the top of said conductive gate.

7. The flash memory device of claim 1, further comprising:
   a source/drain region in said semiconductor substrate laterally adjacent to said conductive spacer; and
   a metal silicide layer on said source/drain region.

8. The flash memory device of claim 1, wherein said conductive spacer is a polysilicon spacer.

9. The flash memory device of claim 1, wherein said conductive gate is polysilicon gate.

10. The flash memory device of claim 1, further comprising a gate dielectric layer between said conductive gate and said semiconductor substrate.

11. A non-volatile memory device, comprising:
    a gate dielectric layer on a semiconductor substrate;
    a polysilicon gate on said gate dielectric layer and having opposite sidewalls;
    a pair of dielectric layers having portions lining said opposite sidewalls of said polysilicon gate respectively;
    a pair of polysilicon spacers patterned on said dielectric layers and disposed adjacent to said opposite sidewalls of said polysilicon gate, respectively; and
    a pair of dielectric spacers patterned on said polysilicon spacers and said dielectric layers and disposed adjacent to said opposite sidewalls of said conductive gate, respectively, wherein said dielectric spacers are directly on said portions of said dielectric layers and directly on said polysilicon spacers.

12. The flash memory device of claim 11, wherein each of said polysilicon spacers is disposed adjacent to a relatively lower portion said sidewall of said polysilicon gate, and each of said dielectric spacers is disposed adjacent to a relatively upper portion of said sidewall of said polysilicon gate.

13. The flash memory device of claim 11, wherein said dielectric spacer comprises silicon oxide, silicon nitride, or combinations thereof.

* * * * *